(12) United States Patent
Holland et al.

(10) Patent No.: US 12,124,302 B2
(45) Date of Patent: Oct. 22, 2024

(54) HIGH-CAPACITY MEMORY AIR COOLING DEVICE

(71) Applicant: Lenovo Enterprise Solutions (Singapore) Pte. Ltd., New Tech Park (SG)

(72) Inventors: Jeffrey S Holland, Newton, NC (US); Rachel Pollock, Pittsboro, NC (US); Bejoy J Kochuparambil, Apex, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 238 days.

(21) Appl. No.: 17/903,770

(22) Filed: Sep. 6, 2022

(65) Prior Publication Data

US 2024/0077918 A1 Mar. 7, 2024

(51) Int. Cl.
*G06F 1/20* (2006.01)
*H05K 7/20* (2006.01)

(52) U.S. Cl.
CPC ............ *G06F 1/20* (2013.01); *H05K 7/20145* (2013.01); *H05K 7/20154* (2013.01);
(Continued)

(58) Field of Classification Search
CPC ...... G06F 1/20; G06F 2200/201; G06F 1/185; G06F 1/203; G06F 1/206; H05K 7/20509; H05K 1/0203; H05K 7/20809; H05K 2201/10159; H05K 7/20154; H05K 7/20436; H05K 2201/066; H05K 7/20172;
(Continued)

(56) References Cited

U.S. PATENT DOCUMENTS 6,711,021 B1 * 3/2004 Morris ............... H05K 7/20154
361/721
7,969,736 B1 * 6/2011 Iyengar ............... H01L 23/4338
174/15.1
(Continued)

OTHER PUBLICATIONS

"Xilence Heatpipe RAM Cooler, Single," Quiet PC, known about and downloaded on Apr. 14, 2022, pp. 1-4.
(Continued)

*Primary Examiner* — Michael A Matey
(74) *Attorney, Agent, or Firm* — Kunzler Bean & Adamson; Bruce R. Needham

(57) ABSTRACT

A combination heat sink/air director apparatus includes conduction plates extending into gaps between dual in-line memory module ("DIMM") installed in computing device. A plurality of thermal interface material ("TIM") pads are coupled to each side of each of the plurality of conduction plates. A heat sink thermally is coupled to the conduction plates and mounted above the conduction plates. Air impedance of air flow through an interface includes air flow to the heat sink is selected to balance air flow between the interface and components adjacent to the interface. A chosen percentage of air flow passes through the interface for the balance of air flow. Each conduction plate and the TIM pads coupled to each side of the conduction plate are sized to contact and thermally couple to the DIMMs of the plurality of DIMMs on either side of the conduction plate and associated TIM pads.

20 Claims, 8 Drawing Sheets

(52) U.S. Cl.
CPC ..... *H05K 7/20409* (2013.01); *H05K 7/20509* (2013.01); *H05K 7/20736* (2013.01); *G06F 2200/201* (2013.01)

(58) Field of Classification Search
CPC ........... H05K 7/20145; H05K 7/20409; H05K 7/20736; H05K 7/2049; H05K 7/20727; H05K 1/021; H05K 7/20163; H01L 21/4882; H01L 23/4093; F28F 2215/12
See application file for complete search history.

(56) References Cited

U.S. PATENT DOCUMENTS

| | | | |
|---|---|---|---|
| 8,659,897 | B2 | 2/2014 | Meijer et al. |
| 2005/0201063 | A1* | 9/2005 | Lee ...................... H01L 23/467 361/715 |
| 2006/0049502 | A1* | 3/2006 | Goodwin ................ G06F 1/184 257/E23.102 |
| 2006/0250772 | A1* | 11/2006 | Salmonson ............... G06F 1/20 361/698 |
| 2016/0363973 | A1* | 12/2016 | Cudak ..................... H01L 25/00 |
| 2019/0045663 | A1* | 2/2019 | Shia ........................ H05K 7/20809 |
| 2019/0132995 | A1* | 5/2019 | Qu ........................... F28F 3/02 |
| 2020/0137923 | A1* | 4/2020 | Qu ..................... H05K 7/20145 |
| 2020/0159294 | A1* | 5/2020 | Franz ......................... G06F 1/20 |
| 2021/0059066 | A1* | 2/2021 | Naas .................. H05K 5/0026 |
| 2021/0153335 | A1* | 5/2021 | Huang ................. H05K 3/303 |
| 2021/0321528 | A1* | 10/2021 | Curtis ................. H05K 5/0021 |
| 2021/0321543 | A1* | 10/2021 | Tan ........................... G11C 5/04 |
| 2022/0210906 | A1* | 6/2022 | Subrahmanyam ... H05K 7/2049 |
| 2022/0225542 | A1* | 7/2022 | Subrahmanyam ....... G11C 5/04 |

OTHER PUBLICATIONS

Btarunr, "Xigmatek Releaseas Dragoon HDT N422 Memory Module Heatsink," TechPowerUp, dated Feb. 20, 2009, pp. 1-3.
Nathan Kirsch, "Walton Chaintech Announces APOGEE GT DDR3 1800 4GB Memory Kits," LegitReviews, dated Jul. 25, 2008, pp. 1-2.
"Intel Optane 512GB DDR-T Persistent Memory Module NMB1XXD512GPSU4," Newegg, known about and downloaded on Apr. 15, 2022, pp. 1-4.

* cited by examiner

HIGH-CAPACITY MEMORY AIR COOLING DEVICE

FIELD

The subject matter disclosed herein relates to cooling of memory and more particularly relates to cooling of memory of dual in-line memory modules installed in a computing device with a combination heat sink and air director apparatus.

BACKGROUND

Memory thermal design power ("TDP") and densities are increasing with newer technologies. Higher capacity in memory typically means higher power. 128 gigabyte ("GB") memory cards may require 12 watts ("W") and 256 GB memory cards may require 15 W. Memory location within a server and server layout impact the airflow and surface area available for memory cooling. Denser component layout in some servers requires smaller dual in-line memory module ("DIMM") spacing. In a DIMM bank, the DIMMs towards the edges tend to receive less airflow than the middle DIMMs. Some DIMM banks in monolithic and shadowed server designs require rear memory placement, which then receives preheated air from memory in front of the rear memory. Edge computing air inlet temperatures are also increasing. Air baffles are often used to force air into central processing unit ("CPU") heat sinks and DIMM banks. However, air baffles increase fan operating pressures and reduce overall air flow. Air baffles also add cost. Some servers will be limited in DIMM capacity and inlet temperature support due to these increasing cooling demands.

Some custom memory is equipped with heat sinks. However, using custom memory with pre-installed heat sinks and other cooling requires customization of a server to create space for the custom memory. In addition, the custom memory can only be used in some applications and is a more expensive solution than use of standard sized DIMMs. CL

BRIEF SUMMARY

A combination heat sink and air director apparatus includes a plurality of conduction plates. Each conduction plate is positioned to extend into a gap between adjacent DIMMs of a plurality of DIMMs previously installed in DIMM slots of a motherboard of a computing device. The apparatus includes a plurality of TIM pads where TIM pads of the plurality of TIM pads are coupled to each side of each of the plurality of conduction plates. The apparatus includes a heat sink thermally coupled to the conduction plates and mounted above the conduction plates. An air impedance of air flow through an interface includes air flow to the heat sink is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

A computing device includes a motherboard comprising a processor, a plurality of DIMM slots coupled to the motherboard, a plurality of DIMMs inserted into each of the plurality of DIMM slots, and a combination heat sink and air director apparatus. The combination heat sink and air director apparatus includes a plurality of conduction plates, where each conduction plate is positioned to extend into a gap between adjacent DIMMs of the plurality of DIMMs after insertion of the DIMMs into the DIMM slots, a plurality of TIM pads, where TIM pads of the plurality of TIM pads are coupled to each side of each of the plurality of conduction plates, and a heat sink thermally coupled to the conduction plates and mounted above the conduction plates. An air impedance of air flow through an interface comprising air flow to the heat sink is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

A combination heat sink and air director apparatus includes a plurality of conduction plates. Each conduction plate is positioned to extend into a gap between adjacent DIMMs of a plurality of DIMMs previously installed in DIMM slots of a motherboard of a computing device. The apparatus includes a plurality of TIM pads, where TIM pads of the plurality of TIM pads are coupled to each side of each of the plurality of conduction plates, a heat sink thermally coupled to the conduction plates and mounted above the conduction plates, and one or more air director components. An air impedance of air flow through an interface such that air flow to at least the heat sink and the one or more air director components is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
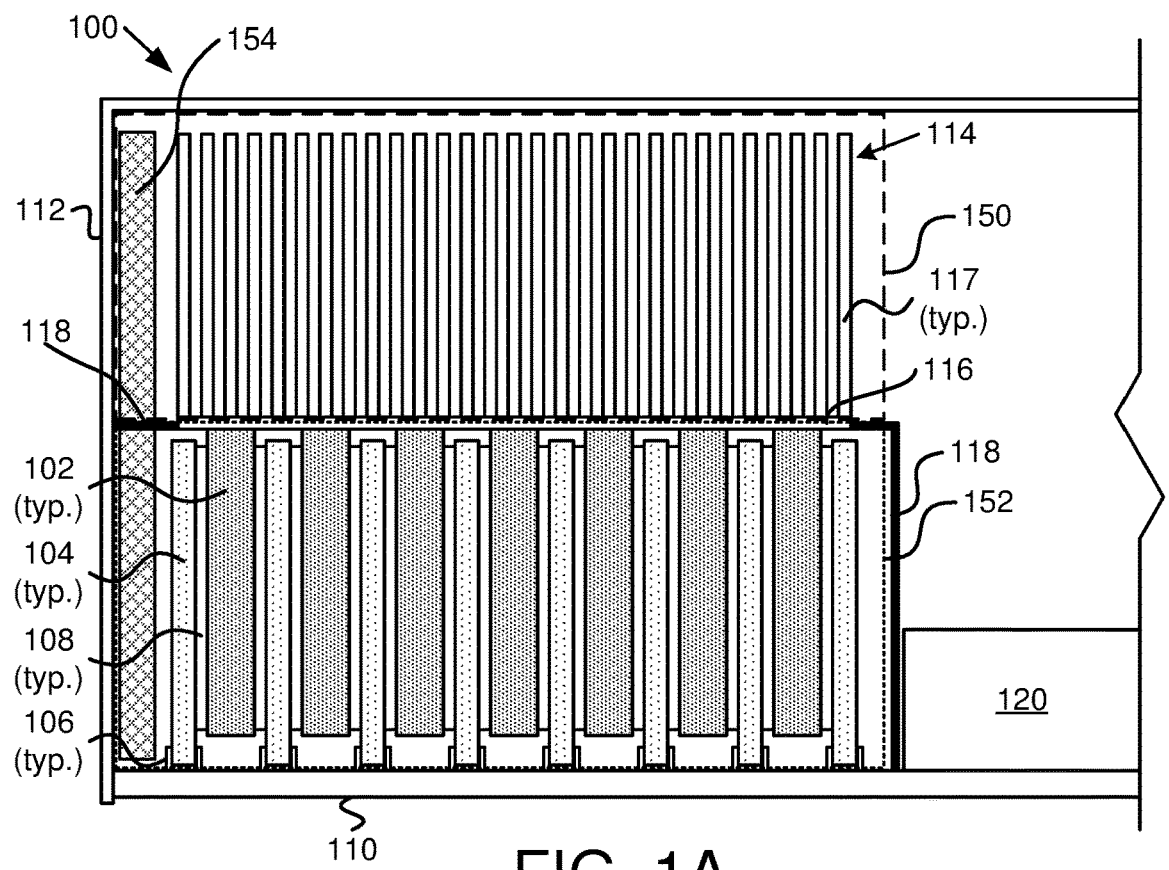
FIG. 1A is a diagram illustrating a side section view of a combination heat sink and air director apparatus, according to various embodiments.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A combination heat sink and air director apparatus includes a plurality of conduction plates. Each conduction plate is positioned to extend into a gap between adjacent DIMMs of a plurality of DIMMs previously installed in DIMM slots of a motherboard of a computing device. The apparatus includes a plurality of TIM pads where TIM pads of the plurality of TIM pads are coupled to each side of each of the plurality of conduction plates. The apparatus includes a heat sink thermally coupled to the conduction plates and mounted above the conduction plates. An air impedance of air flow through an interface includes air flow to the heat sink is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

In some embodiments, thickness of fins of the heat sink, spacing between the fins, height of the fins, and/or air director components in an area along sides and top of the heat sink are chosen to provide the air impedance of air flow through the interface. In other embodiments, the combination heat sink and air director apparatus includes one or more air director components positioned as part of the interface and configured to contribute to the balance of air flow by producing air flow direction and/or air impedance contributing to the balance of air flow between the interface and the components of the computing device adjacent to the interface.

In some embodiments, the interface includes the conduction plates, the TIM pads and the plurality of DIMMs and the conduction plates, TIM pads, heat sink, and/or one or more air director components are located and shaped to provide an amount of air flow at the interface to allow the chosen percentage of air flow to pass through the interface. In further embodiments, each conduction plate of the plurality of conduction plates and associated TIM pads of the plurality of TIM pads are sized to extend along a length of the gap between DIMMs of the plurality of DIMMs an amount to allow a chosen amount of air flow around the conduction plates, TIM pads and DIMMs and to conduct a selected amount of heat from the DIMMs to the TIM pads and conduction plates to the heat sink.

In some embodiments, each of the plurality of conduction plates includes one or more heat pipes coupled to the heat sink. In other embodiments, the combination heat sink and air director apparatus includes a heat spreader coupled to the one or more heat pipes. In other embodiments, each conduction plate of the plurality of conduction plates and associated TIM pads of the plurality of TIM pads substantially extend along a length of the gap between DIMMs of the plurality of DIMMs. In other embodiments, a TIM pad positioned between a DIMM of the plurality of DIMMs and a conduction plate of the plurality of conduction plates is in thermal contact with a memory chip and/or a controller of the DIMM. In other embodiments, the memory chip and the controller extend a different distance away from a circuit board of each DIMM of the plurality of DIMMs and wherein each TIM pad of the plurality of TIM pads deforms to come into thermal contact with both the memory chip and the controller when a conduction plate of the plurality of conduction plates with TIM pads of the plurality of TIM pads on each side is inserted between DIMMs of the plurality of DIMMs.

In some embodiments, air flow through the computing device is in a direction parallel to slots for the plurality of DIMMs and the interface is at an upstream side of the plurality of DIMMs. In other embodiments, at least one of the components of the computing device adjacent to the interface comprises a processor. In other embodiments, the combination heat sink and air director apparatus includes a conduction plate extending along an outer side of a DIMM of the plurality of DIMMs at an end of the plurality of DIMMs and a TIM pad coupled to the conduction plate and positioned between the DIMM and the conduction plate.

A computing device includes a motherboard comprising a processor, a plurality of DIMM slots coupled to the motherboard, a plurality of DIMMs inserted into each of the plurality of DIMM slots, and a combination heat sink and air director apparatus. The combination heat sink and air director apparatus includes a plurality of conduction plates, where each conduction plate is positioned to extend into a gap between adjacent DIMMs of the plurality of DIMMs after insertion of the DIMMs into the DIMM slots, a plurality of TIM pads, where TIM pads of the plurality of TIM pads are coupled to each side of each of the plurality of conduction plates, and a heat sink thermally coupled to the conduction plates and mounted above the conduction plates. An air impedance of air flow through an interface comprising air flow to the heat sink is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

In some embodiments, thickness of fins of the heat sink, spacing between the fins, height of the fins, and/or air director components in an area along sides and top of the heat sink are chosen to provide the air impedance of air flow through the interface. In other embodiments, the combination heat sink and air director apparatus includes one or more air director components positioned as part of the interface and configured to contribute to the balance of air flow by producing air flow direction and/or air impedance contributing to the balance of air flow between the interface and the components of the computing device adjacent to the interface.

In some embodiments, the interface includes the conduction plates, the TIM pads and the plurality of DIMMs and the conduction plates, TIM pads, heat sink, and/or one or more air director components are located and shaped to provide an amount of air flow at the interface to allow the chosen percentage of air flow to pass through the interface. In other embodiments, each conduction plate of the plurality of conduction plates and associated TIM pads of the plurality of TIM pads are sized to extend along a length of the gap between DIMMs of the plurality of DIMMs an amount to allow a chosen amount of air flow around the conduction plates, TIM pads and DIMMs and to conduct a selected amount of heat from the DIMMs to the TIM pads and conduction plates to the heat sink. In other embodiments, a TIM pad positioned between a DIMM of the plurality of DIMMs and a conduction plate of the plurality of conduction plates is in thermal contact with a memory chip and/or a controller of the DIMM.

A combination heat sink and air director apparatus includes a plurality of conduction plates. Each conduction plate is positioned to extend into a gap between adjacent DIMMs of a plurality of DIMMs previously installed in DIMM slots of a motherboard of a computing device. The apparatus includes a plurality of TIM pads, where TIM pads of the plurality of TIM pads are coupled to each side of each of the plurality of conduction plates, a heat sink thermally coupled to the conduction plates and mounted above the conduction plates, and one or more air director components. An air impedance of air flow through an interface such that air flow to at least the heat sink and the one or more air director components is selected to balance air flow between the interface and components of the computing device adjacent to the interface. A chosen percentage of air flow passes through the interface for the balance of air flow. A conduction plate of the plurality of conduction plates and the TIM pads coupled to each side of the conduction plate are sized to contact and thermally couple to the DIMMs of the plurality of DIMMs on either side of the conduction plate and associated TIM pads.

Figure 1B:
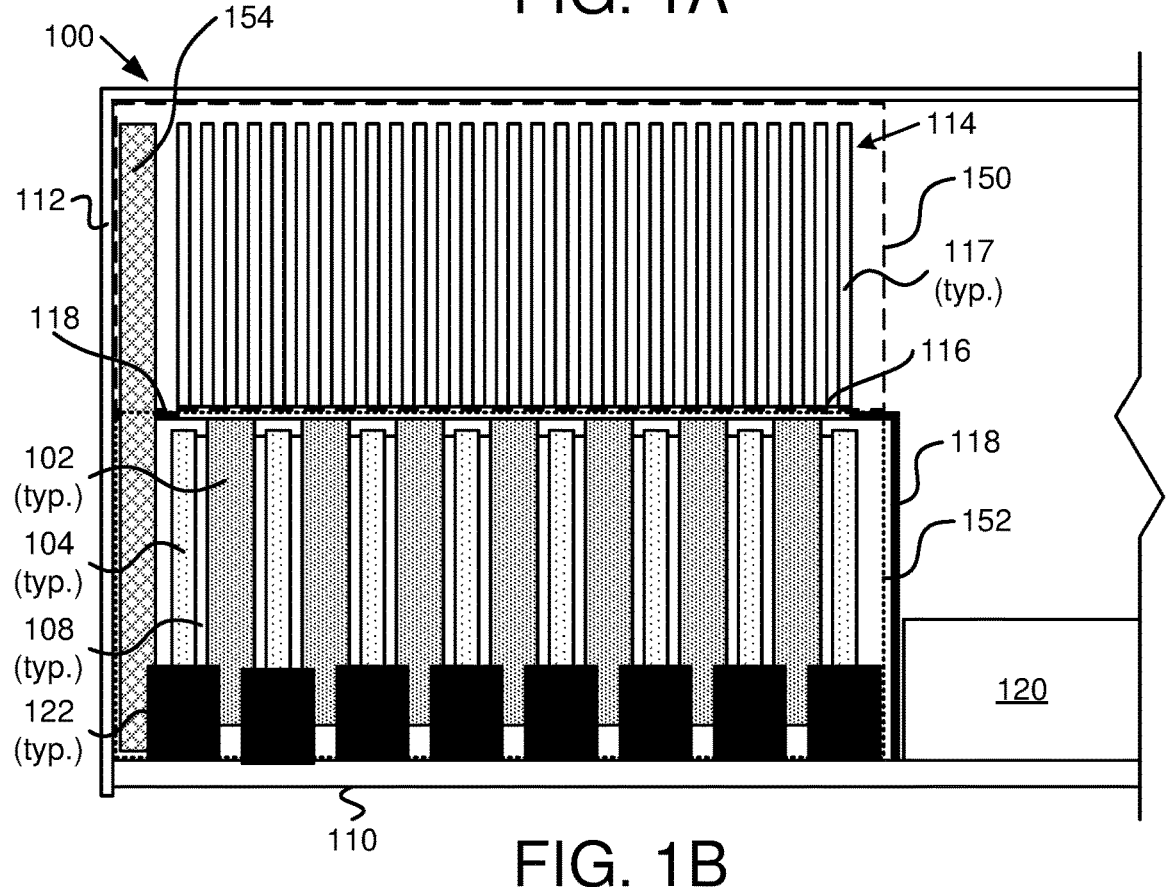
FIG. 1B is a diagram illustrating a side view of the combination heat sink and air director apparatus of FIG. 1A.
Figure 1C:
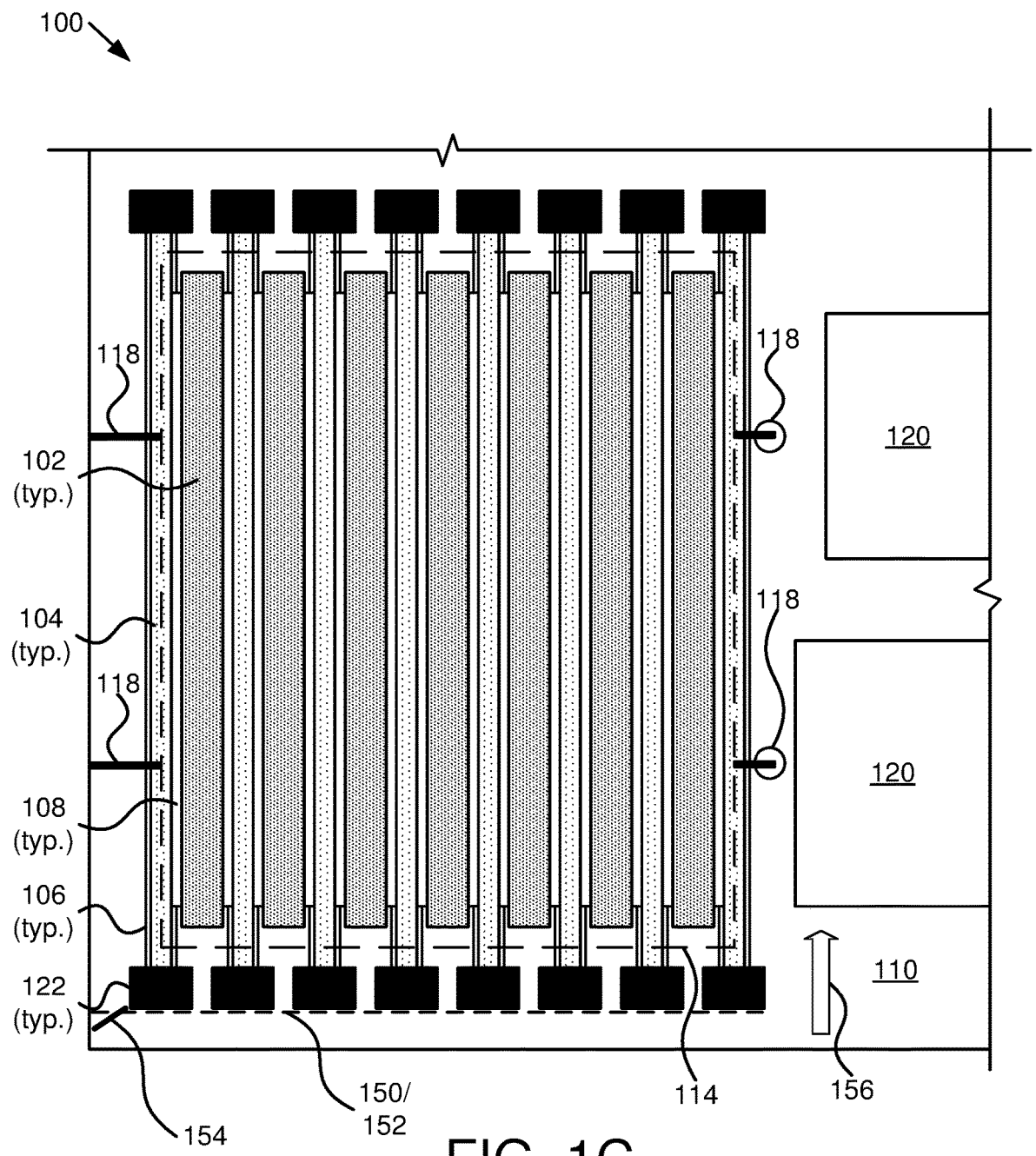
FIG. 1C is a diagram illustrating a top section view of the combination heat sink and air director apparatus of FIG. 1A.

FIG. 1A is a diagram illustrating a side section view of a combination heat sink and air director apparatus 100, according to various embodiments. FIG. 1B is a diagram illustrating a side view of the combination heat sink and air director apparatus 100 of FIG. 1A and FIG. 1C is a diagram illustrating a top section view of the combination heat sink and air director apparatus 100 of FIGS. 1A and 1B. FIG. 1B is the same as FIG. 1A except clips 122 that latch a DIMM 104 in a DIMM slot 106 are visible.

Often memory cards come in a standard form called a dual in-line memory module, or "DIMM." A DIMM includes a printed circuit board of a specific height and length with components on one or both sides. A bottom of a DIMM includes metallic traces or "pins" configured to connect to contacts at the bottom of a DIMM slot 106. A user pushes a DIMM down into a DIMM slot 106 and clips 122 are folded up to secure the DIMM into place. DIMMs 104 have become a fairly standard way to attach memory to a motherboard 110. While DIMMs 104 typically have a standard length and height, component placement on a DIMM 104 and a height of the components of a DIMM 104 vary from DIMM to DIMM.

The combination heat sink and air director apparatus 100 includes a plurality of conduction plates 102 where each conduction plate 102 is positioned to extend into a gap between adjacent dual in-line memory modules ("DIMMs") 104 of a plurality of DIMMs 104 previously installed in DIMM slots 106 of a motherboard 110 of a computing device. The combination heat sink and air director apparatus 100 also includes a plurality of thermal interface material ("TIM") pads 108. TIM pads 108 of the plurality of TIM pads 108 are coupled to each side of each of the plurality of conduction plates 102 for conduction plates 102 inserted between DIMMs 104. The motherboard 110 is located in a chassis 112 and includes other components 120. The conduction plates 102 and attached TIM pads 108 are of the combination heat sink and air director apparatus 100 are designed to slide down into the gap between DIMMs 104 after the DIMMs 104 are already in place.

The computing device, in some embodiments, is a rack-mounted server, such as a standard horizontally mounted server, or such as a blade server, which is often more compact and may be vertically mounted. In other embodiments, the computing device is a desktop computer, a workstation, a laptop computer, or the like. The computing device includes a motherboard 110 that includes one or more processors. Often the processors of the computing device are the primary heat generating devices of the computing device and require more cooling than the DIMMs 104 or other devices. However, the DIMMs 104 also require cooling, especially as inlet air temperatures rise and memory density increases.

Use of the conduction plates 102 with TIM pads 108 provides a way to use standard DIMMs 104, and then once the DIMMs 104 are installed, the conduction plates and TIM pads 108 are installed at least in gaps between the DIMMs 104. The TIM pads 108 conduct heat from the DIMMs 104 to the conduction plates 102, which transfer heat to a heat sink 114. In the embodiments of the combination heat sink and air director apparatus 100 of FIGS. 1A-1C, the heat sink 114 is installed over the DIMMs 104 and the conduction plates 102 are thermally coupled to the heat sink 114. In some embodiments, the heat sink 114 includes a heat sink base 116 and fins 117 extending from the heat sink base 116. In some embodiments, the conduction plates 102 are thermally coupled to the heat sink base 116. In other embodiments, the conduction plates 102 are also mechanically coupled to the heat sink base 116.

The conduction plates 102 extend to a depth into a gap between DIMMs 104 or adjacent to an end DIMM 104 sufficient to contact the DIMM 104 and to conduct enough heat from the DIMM 104 to be effective. In some embodiments, the conduction plates 102 extend to a depth in a gap between DIMMs 104 for TIM pads 108 of the conduction plates 102 to contact particular components of the DIMMs 104 that generate the most heat, such as a memory controller, a memory chip, or other type of memory chip, etc. The memory chip may be a dynamic random-access memory ("DRAM") chip. In some examples, the conduction plates 102 extend to a bottom edge of heat generating components. In other examples, the conduction plates 102 extend to a depth for TIM pads 108 of the conduction plates 102 to contact the heat generating components sufficiently to conduct enough heat to be effective. For example, a conduction plate 102 may extend to a middle of a heat generating component where the TIM pad 108 of the conduction plate 102 has a heat conduction rate that is sufficient for cooling the heat generating component. In some embodiments, the conduction plates 102 extend close enough to a bottom of the DIMMs 104 to cover a variety of types of DIMMs 104.

Typically, a DIMM 104 has a particular length to be able to fit in a DIMM slot 106 where length is in a direction in line with the DIMMs 104. In some embodiments, each conduction plate 102 and associated TIM pads 108 substantially extends along a length of the gap between DIMMs 104. As used herein, a conduction plate 102 and associated TIM pads 108 substantially extending along a length of the gap between DIMMs 104 includes the conduction plate 102 and associated TIM pads 108 extending at least 60 percent of a length of a DIMM 104. In some embodiments, the conduction plates 102 and associated TIM pads 108 do not extend a full length of the gap between DIMMs 104 to match where components of the DIMMs 104 are expected. For example, a DIMM 104 may include portions at the ends of the DIMM 104 adjacent to the clips 122 that do not include components. In other embodiments, the conduction plate 102 and associated TIM pads 108 have a length sufficient to contact heat generating components of a majority of available DIMMs 104. One of skill in the art will recognize reasonable lengths of conduction plate 102 and associated TIM pads 108 to contact heat generating components of a wide variety of DIMMs 104.

Figure 5A:
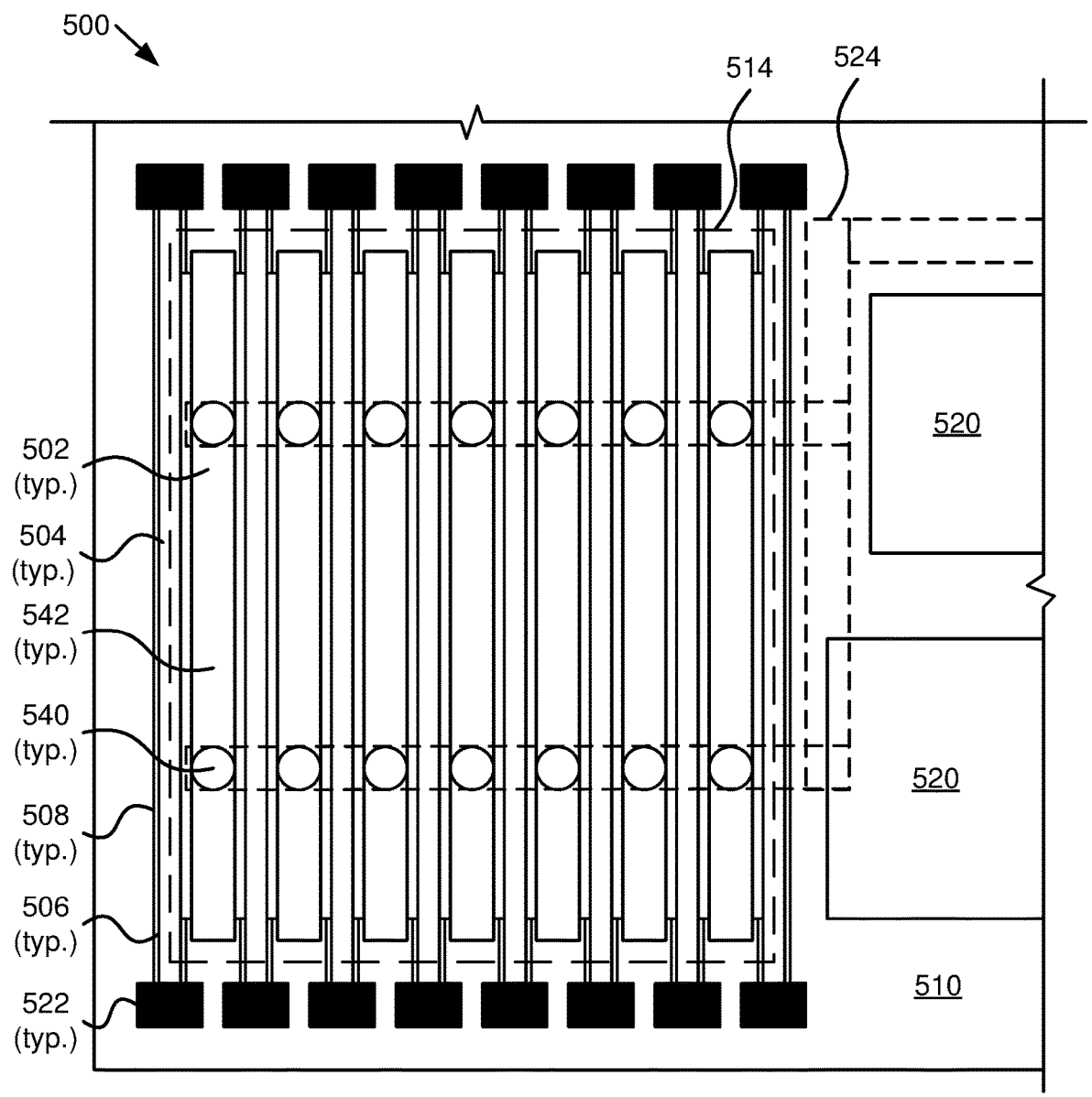
FIG. 5A is a diagram illustrating a top view of a combination heat sink and air director apparatus with conduction plates with heat pipes and heat spreaders, according to various embodiments.
Figure 5B:
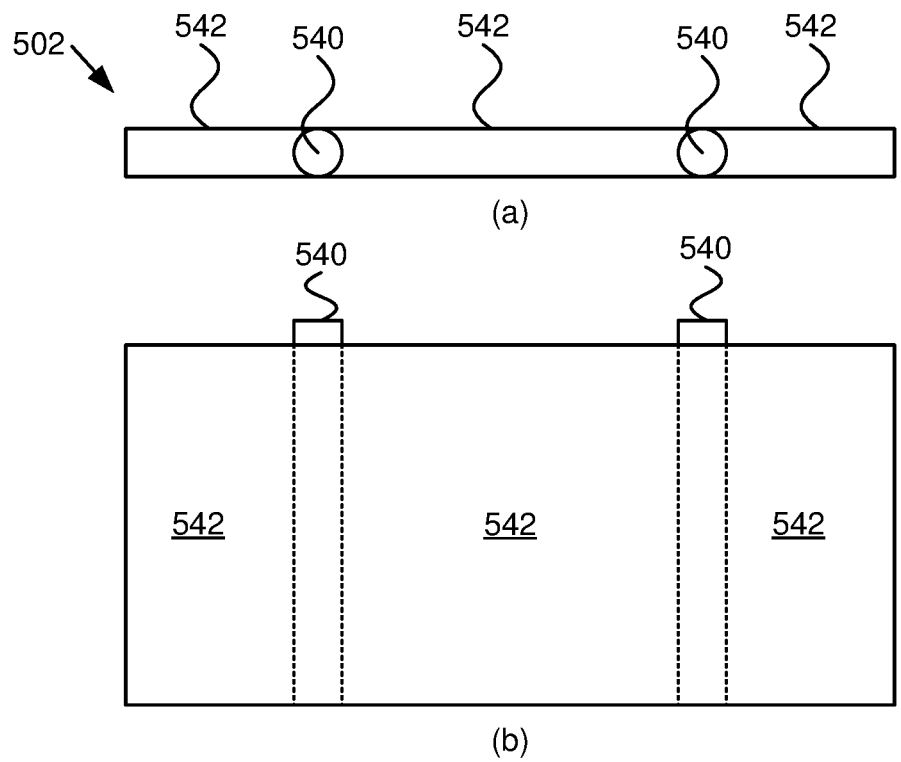
FIG. 5B is a diagram illustrating a top view and a side view of a conduction plate with heat pipes and heat spreaders from the combination heat sink and air director apparatus of FIG. 5A.
Figure 5C:
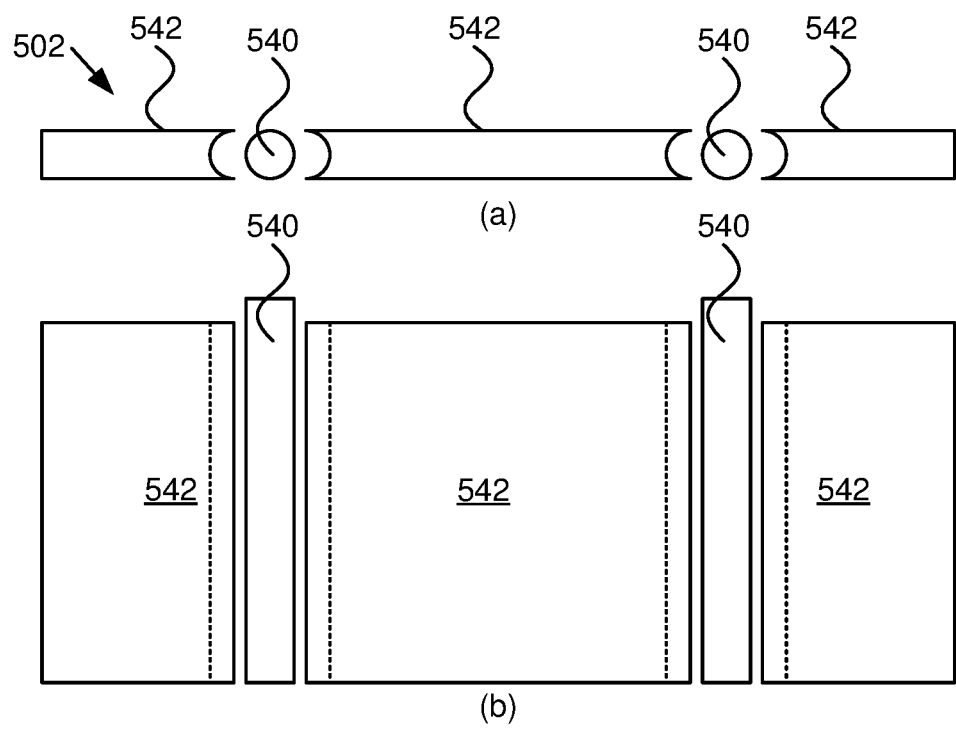
FIG. 5C is a diagram illustrating an exploded top view and side view of the conduction plate with heat pipes and heat spreaders from the combination heat sink and air director apparatus of FIG. 5A.

The conduction plates 102 are configured to transfer heat away from the TIM pads 108 to the heat sink 114. The conduction plates 102 include a material capable of conducting heat from the TIM pads 108 to the heat sink 114. In some embodiments, at least a portion of the conduction plates 102 are metal. In other embodiments, at least a portion of the conduction plates 102 include one or more non-metallic portions, such as those made of ceramic, a polymer, graphite, etc. In some embodiments, the conduction plates 102 include heat pipes as depicted in FIGS. 5A-5C. For example, conduction plates 102 that include heat pipes may include one or more heat pipes in contact with certain components of a DIMM 104, such as a memory chip, a memory controller, etc. Conduction plates 102 having heat pipes without other components may need to be customized for each type of DIMM 104.

A heat pipe typically is configured to evaporate a liquid at a heat source. Expansion of the fluid transitioning to a vapor state helps to move the vapor to a cool end of the heat pipe where the vapor is condensed to a liquid state. The fluid in a liquid state then moves to the hot end of the heat pipe using a wicking action or capillary action. In other embodiments, the conduction plates 102 include a thermosiphon, a vapor chamber, a heat spreader, or the like. Thermosiphon is a method of passive heat exchange, based on natural convection, which circulates a fluid without a pump. A thermosiphon, in some embodiments, is used with a conduction plate 102 to move heat to the heat sink 114. A thermosiphon, unlike a heat pipes and vapor chambers, typically does not have a wicking component. In some embodiments, thermosiphons rely on gravity to return liquid to a hot end of the thermosiphon. A vapor chamber, in some embodiments, operates on a similar principle as a heat pipe but is planar and may be called a planar heat pipe.

In some embodiments, the conduction plates 102 have a planar surface where a TIM pad 108 is attached and are configured to be used with a variety of DIMMs 104. Having a planar surface and a TIM pad 108 that is flexible enables a conduction plate 102 and associated TIM pads 108 to deform as needed when installed to contact various components of the variety of DIMMs 104. As the conduction plates 102 are slid into the gap between DIMMs 104, the TIM pads 108 deform as needed to contact heat generating components of the DIMMs 104. In other embodiments, the conduction plates 102 include a combination of thermally conductive components and/or materials. Conduction plates 102 that include heat pipes and heat spreaders are depicted in FIGS. 5A-5C.

The TIM pad 108, in various embodiments, includes a TIM material capable of being coupled to the conduction plates 102 and deforming as necessary to provide enough contact with the DIMMs 104 to conduct heat. TIM pads 108 may be called gap pads. In some embodiments, the TIM pads 108 are thermally conductive pads that come in a solid but soft state and are capable of being adhered to the conduction plates 102. In other embodiments, the TIM pads 108 include a thermal tape. In other embodiments, the TIM pads 108 include a phase-change material, which typically comes in a solid form and may partially melt to fill gaps. The TIM pads 108, in some embodiments, include a soft material with some elasticity capable of deforming and also capable of maintaining sufficient pressure on the DIMMs 104 to form a thermally conductive coupling with the DIMMs 104. One of skill in the art will recognize other materials suitable for TIM pads 108.

Figure 2A:
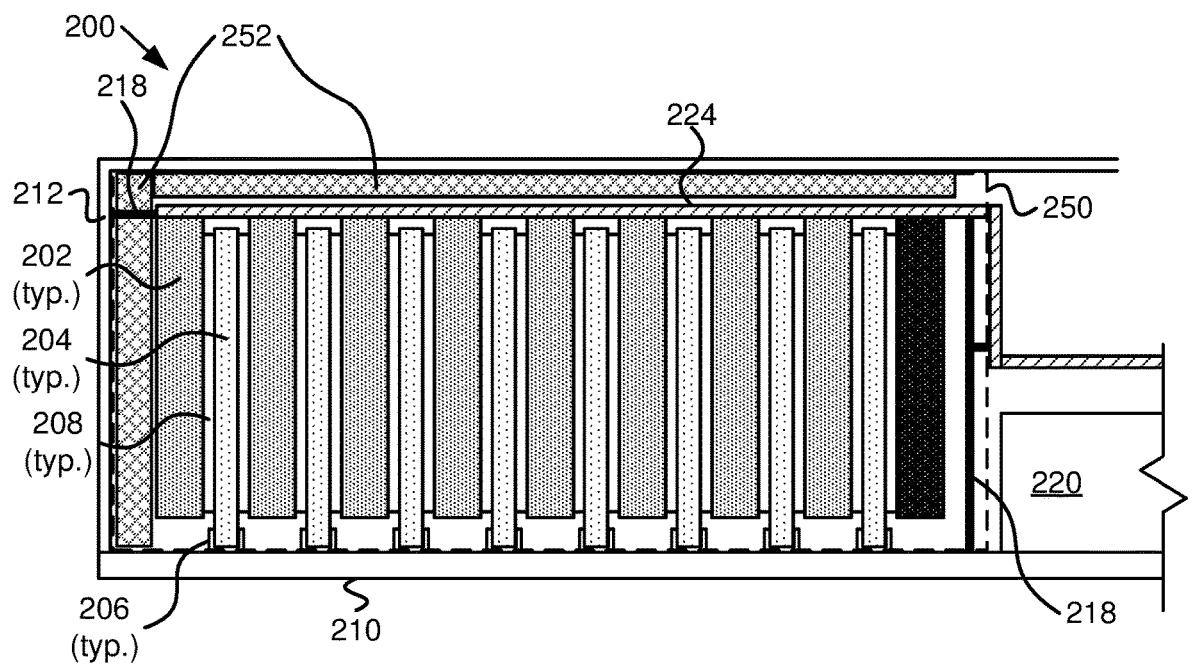
FIG. 2A is a diagram illustrating a side section view of a combination heat sink and air director apparatus with a remote heat sink, according to various embodiments.
Figure 2B:
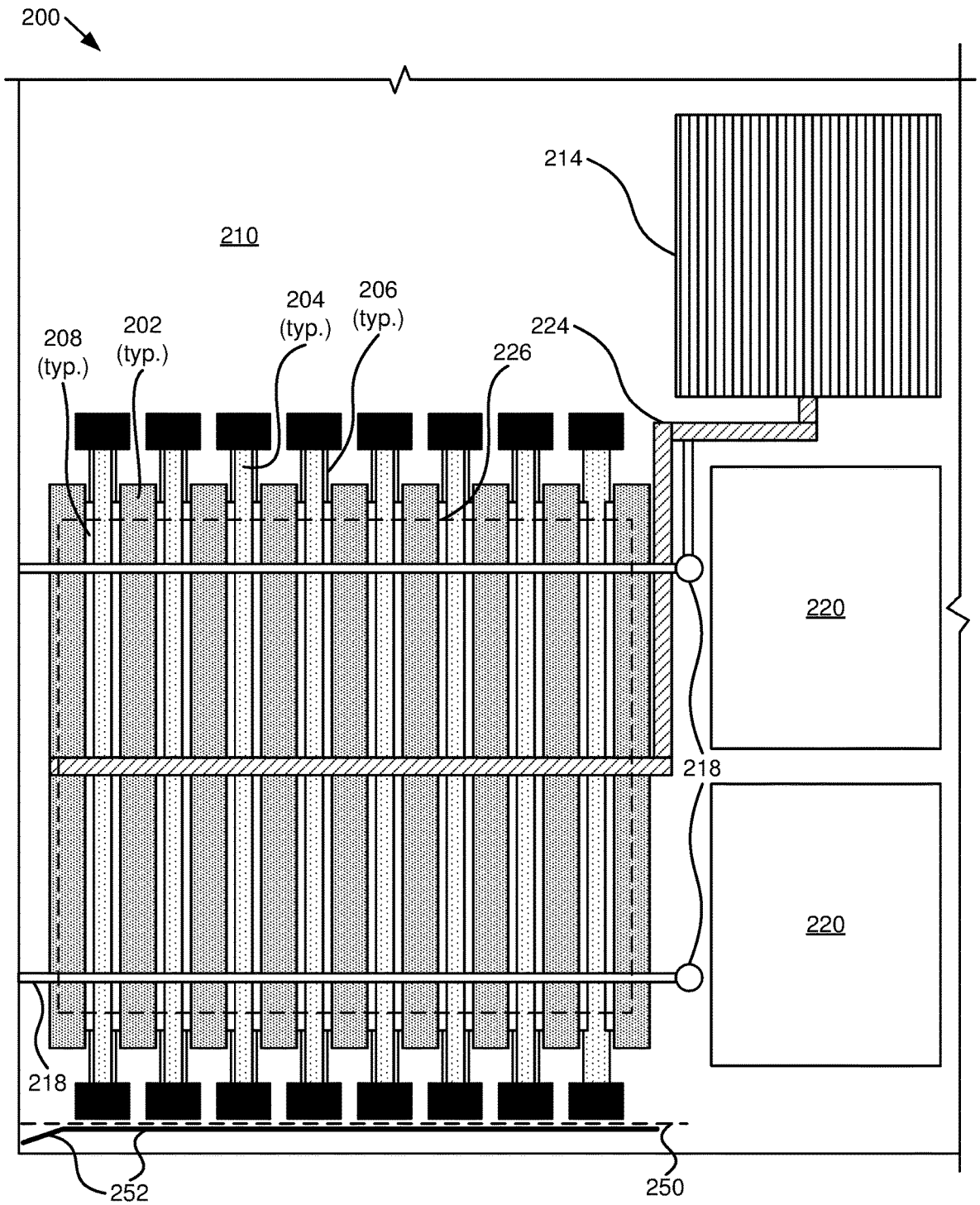
FIG. 2B is a diagram illustrating a top view of the combination heat sink and air director apparatus of FIG. 2A.

In some embodiments, the conduction plates 102 connect directly to a heat sink 114, as depicted in the combination heat sink and air director apparatus 100 of FIGS. 1A-1C. In other embodiments, the remote heat sink 214 is remote from the conduction plates 102, as depicted in FIGS. 2A-2B. Where the conduction plates 102 connect directly to the heat sink 114, the heat sink 114 may include a heat sink base 116 that serves as a connection point for the conduction plates 102 and fins 117. The combination heat sink and air director apparatus 100 of FIGS. 1A-1C requires space above the DIMMs 104. In some examples, the heat sink 114 occupies a space where an air baffle could be placed. Rack mounted equipment is typically classified in discrete heights such as 1 U, 2 U, 3 U, etc. A rack unit ("U") is typically 4.445 centimeters (1.75 inches). A 1 U component is typically a minimum height where a 2 U component has twice the height as a 1 U component, a 3 U component has a height that is three times that of a 1 U component, etc. A 2 U, 3 U, or 4 U server may have enough space above the DIMMs 104 for a heat sink 114. A 1 U server may not have enough space above the DIMMs for a heat sink 114.

The heat sink 114 is positioned to transfer heat from the conduction plates 102 to a fluid for transport of the heat out of the computing device. In some embodiments, the fluid is air and the heat sink 114 is located in an air stream. The heat sink 114 of FIGS. 1A-1C is positioned above the DIMMs 104 and is intended to be in an air stream above the DIMMs 104. In other embodiments, the heat sink 114 is located elsewhere. In some embodiments, the fluid transporting heat from the heat sink 114 is a liquid and the heat sink 114 includes tubes to transport the heat in and out of the heat sink 114.

In some embodiments, the heat sink 114 and/or conduction plates 102 are secured in place with a securing structure 118. The securing structure 118, in some embodiments, connects to the motherboard 110 and/or to the chassis 112. The securing structure 118 may include standoffs extending from the motherboard 110 along with other supports that connect to the heat sink 114 and/or conduction plates 102. The securing structure 118 includes, in some embodiments, connection to the chassis, which may be through the use of screws or other connectors, standoffs, etc. One of skill in the art will recognize other ways to secure the conduction plates 102 and/or the heat sink 114.

The conduction plates 102, TIM pads 108, and heat sink 114 form a combination heat sink and air director apparatus 100 that has a dual function of directing air appropriately to balance air flow through an interface 150 and air flow to components 120 adjacent to the interface 150 while also providing a heat sink function to transfer heat from the DIMMs 104. The combination heat sink and air director apparatus 100 is designed to have a chosen percentage of air flow passing through the interface 150 for the balance of air flow.

Air flow through the computing device is typically from a front side and air exists a back side. As air is pushed through the computing device by fans, thermodynamic design typically provides a certain amount of air flow past components of the computing device that generate a lot of heat. Processors and DIMMs 104 are typically large heat producers within a computing device. Often, processors of a computing device are placed adjacent to DIMMs 104 of the computing device in a direction perpendicular to a direction 156 of the air flow through the computing device. Looking at an interface aligned perpendicular to the air flow and just upstream of the DIMMs 104 and processors, thermodynamic design of the computing device typically leads to a particular percentage of a total amount of air flow at the interface being directed toward the processors and adjacent components (e.g., 120) and a certain amount of air flow being directed to the DIMMs 104 and a space above the DIMMs 104.

In some embodiments, an area above the DIMMs 104 (e.g., interface 150) has been often filled with an air baffle that is designed to balance air flow through and/or around elements of the air baffle with components surrounding the interface 150, such as the DIMMs 104 and other components 120, such as one or more processors. However, air baffles lack an ability to directly pull heat from the DIMMs 104. Where a heat sink 114 is placed above the DIMMs 104, air flow is affected but air flow at the interface 150 must still be balanced with the components 120 adjacent to the DIMMs 104 and air flow through the DIMMs 104. Where the DIMMs 104 have conduction plates 102 and TIM pads 108, air flow through the DIMMs 104 is affected but heat from the DIMMs 104 is transported away through the TIM pads 108 and conduction plates 102 to the heat sink 114.

The combination heat sink and air director apparatus 100, in some embodiments, is designed to replace an air baffle, ducts, air directors, air director components, or the like. Air baffles, ducts, air directors, and other air director components are used to direct air flow of the computing device in particular amounts, locations, etc. To maintain the air flow, components of the combination heat sink and air director apparatus 100 are designed to maintain a same air pressure resistance as the air director components being replaced so that air flow and thermodynamics of the computing device do not have to be redesigned based on the combination heat sink and air director apparatus 100.

In other embodiments, thermodynamic design of the computing device includes designing the heat sink 114 and other areas around the heat sink 114 within the interface 150 to have a particular air impedance to balance air flow to the heat sink 114 with air flow to components 120 of the computing device adjacent to the interface 150 such that a chosen percentage of air flow passes through the interface 150 for the balance of air flow. In some embodiments, thickness of fins 117 of the heat sink 114, spacing between the fins 117, a height of the fins 117, and/or air director components 154 in an area along sides and top of the heat sink 114 are chosen to provide the air impedance of air flow through the interface 150. Thus, air flow to the components 120, 104 adjacent to the interface 150 is balanced with air flow through the interface 150 while providing additional cooling to the DIMMs 104.

In some embodiments, air flow through the interface 150 may be a particular chosen amount in terms of a percentage of the total air flow. For example, air flow through the interface 150 may be chosen to be 20 percent while air flow to adjacent components 120, 104 may be 80 percent to meet thermodynamic design criteria. Where there are two sets of DIMMs 104 with a set of DIMMs 104 on either side of processors, each set of DIMMs 104 and area above the DIMMs 104 may account for 20 percent of the air flow for a total of 40 percent while air flow through other components 120 may be 60 percent. In other embodiments, other percentages are used. In addition, balancing air flow may require vanes, channels, or other air director components 154 to redirect air flow streams, channel air to a specific spot, etc.

In various embodiments, the interface 150 is selected for convenience of the thermodynamic design. While the interface 150 is depicted as a rectangle, other interfaces 150 are shaped differently and may trace an outline of various components. In addition, while the interface 150 is depicted as linear in FIG. 1C, in other embodiments, the interface may be located elsewhere, may vary in terms of the direction 156 of air flow, etc. to meet thermodynamic design criteria. In some examples, the interface 150 is on an upstream side of particular components within a region of the computing device above the DIMMs 104. One of skill in the art will recognize other ways to set an interface 150 in a way that is convenient while balancing air flow to processors, DIMMs 104, etc. for a thermodynamic design.

While thickness, spacing, and height of fins 117 of the heat sink 114 provide some degrees of freedom in achieving a particular air flow impedance at the interface 150, additional degrees of freedom may be provided by air director components 154 placed strategically within the interface 150 in relation to the heat sink 114 on sides and above the heat sink 114. While an air director component 154 is depicted on the left side of the heat sink 114, the air director component 154 is merely representative of any number, style, type, etc. of one or more air director components 154 that may be used to affect air flow impedance through the interface 150. Some air director components 154 may be designed to block air flow. Other air director components 154 may be designed to direct air flow to a particular location. One of skill in the art will recognize other types and designs of air director components 154 to contribute to air flow impedance at the interface 150.

In some embodiments, air flow impedance to balance air flow in the computing device includes the interface 150 above the DIMMs 104 as well as the interface 152 covering the DIMMs 104, as depicted in FIGS. 1A and 1B. Placing conduction plates 102 and TIM pads 108 between DIMMs 104 and possibly on sides of end DIMMs 104 affect air flow through the DIMMs 104. In some embodiments, air flow through this combined interface 150/152 is balanced with air flow of components 120 adjacent to the DIMMs 104 and heat sink 114. Air flow through the DIMMs 104 is restricted due to placement of the conduction plates 102 and TIM pads 108, which then may affect an amount of air flow through the upper interface 150.

In some embodiments where there is a combined interface 150, 152, air flow through the combined interface 150/152 is also balanced with an amount of heat to be removed from the DIMMs 104. In some embodiments, depth that the conduction plates 102 and TIM pads 108 extend into the gap between DIMMs 104, spacing of the fins 117, height of the fins 117, thickness of the fins 117, etc. are varied to meeting heat extraction parameters in addition to meeting air flow impedance to balance air flow through the combined interface 150/152 with air flow through adjacent components 120. Whether the thermodynamic design uses a combined interface 150/152 or considers the top interface 150 separately from the bottom interface 152, the embodiments described herein contemplate a design of the heat sink 114 and/or adjacent air director components 154 or the heat sink 114, conduction plates 102, TIM pads 108, and/or air director components 154 to balance air flow at the upper interface 150 or combined interface 150, 152 with air flow to adjacent components 120 while providing additional heat extraction from the DIMMs 104.

FIG. 2A is a diagram illustrating a side section view of a combination heat sink and air director apparatus 200 with a remote heat sink 214, according to various embodiments. FIG. 2B is a diagram illustrating a top view of the combination heat sink and air director apparatus 200 of FIG. 2A. The combination heat sink and air director apparatus 200 of FIGS. 2A and 2B include conduction plates 202, DIMMs 204, DIMM slots 206, TIM pads 208, a motherboard 210, a chassis 212, a securing structure 218, and other components 220 which are substantially similar to those described above with regard to the combination heat sink and air director apparatus 100 of FIGS. 1A-1C. The combination heat sink and air director apparatus 200 of FIGS. 2A and 2B also includes a remote heat sink 214 located remotely from the DIMMs 104 and a heat transfer structure 224 connected between the conduction plates 202 and the remote heat sink 214.

In the combination heat sink and air director apparatus 200 of FIGS. 2A and 2B, the securing structure 218 runs across the top of the conduction plates 202 and the heat transfer structure 224 connects at a single location a top of the conduction plates 202. In other embodiments, the combination heat sink and air director apparatus 200 includes planar structure 226 similar to the heat sink base 116 in FIGS. 1A and 1C. In FIG. 2B, the planar structure 226 is represented as a dashed rectangle. Where a planar structure 226 is used, the conduction plates 202 may connect to the heat sink base 116 and the heat transfer structure 224 connects to the planar structure 226. In the embodiments, the conduction plates 202 may be rigidly mounted to the planar structure 226 for mechanical support. The planar structure 226 may be a heat spreader, a vapor chamber, or other planar structure. In various embodiments, the planar structure 226 includes a metal or other heat conducting material. For example, the planar structure 226 may include copper or aluminum.

The heat transfer structure 224, in various embodiments, may include a heat pipe, a thermosiphon, a metallic bar, or the like, or a combination of heat transfer devices and the heat transfer structure 224 transfers heat from the conduction plates 202 to the remote heat sink 214. One of skill in the art will recognize other embodiments of a heat transfer structure 224 and/or a planar structure 226.

In some embodiments, the remote heat sink 214 is placed behind processors of the motherboard 210 in terms of air flow. In FIGS. 2A and 2B, the components 220 may be processors. In other embodiments, the remote heat sink 214 is placed elsewhere. In other embodiments, the remote heat sink 214 is split into two or more heat sinks 214 which are placed in convenient locations. An advantage of a remote heat sink 214 is an ability to place the remote heat sink 214 at a level equal with the DIMMs 204, which is convenient when space above the DIMMs 204 is unavailable. For example, a remote heat sink 214 may be used in a 1 U server. Another advantage of a remote heat sink 214 is the remote heat sink 214 may be placed in an air stream or other convenient location to transport heat from the remote heat sink 214.

The combination heat sink and air director apparatus 200 of FIGS. 2A and 2B includes conduction plates 202 that are outside of the DIMMs 204 at the end of the row of DIMMs 204. The outer conduction plates 202 and associated TIM pads 208 provide additional cooling for the DIMMs 204 at the ends of a bank of DIMMs 204. The outer conduction plates 202 have forces from the adjacent DIMM 204 pushing outward on the conduction plates 202 without an equal force from another DIMM 204. In some embodiments, the outer conduction plates 202 have additional mechanical support because the outer conduction plates 202 have forces from the DIMMs 204 on one side instead of both sides.

In the combination heat sink and air director apparatus 200 of FIGS. 2A and 2B, an interface 250 is depicted. Conduction plates 202 and TIM pads 208 are depicted between and on edges of the DIMMs 204, which affect air flow through the interface 250. As with the combination heat sink and air director apparatus 100 of FIGS. 1A-1C, air flow impedance at the interface 250 is chosen to balance air flow through the interface 250 with air flow past components 220 adjacent to the interface 250. In some embodiments, air channels above and to the sides of the DIMMs 204, conduction plates 202, and TIM pads 208 may be increased to compensate for insertion of the conduction plates 202 and TIM pads 208. In other embodiments, air director components 252 may be used to affect air flow.

Figure 3:
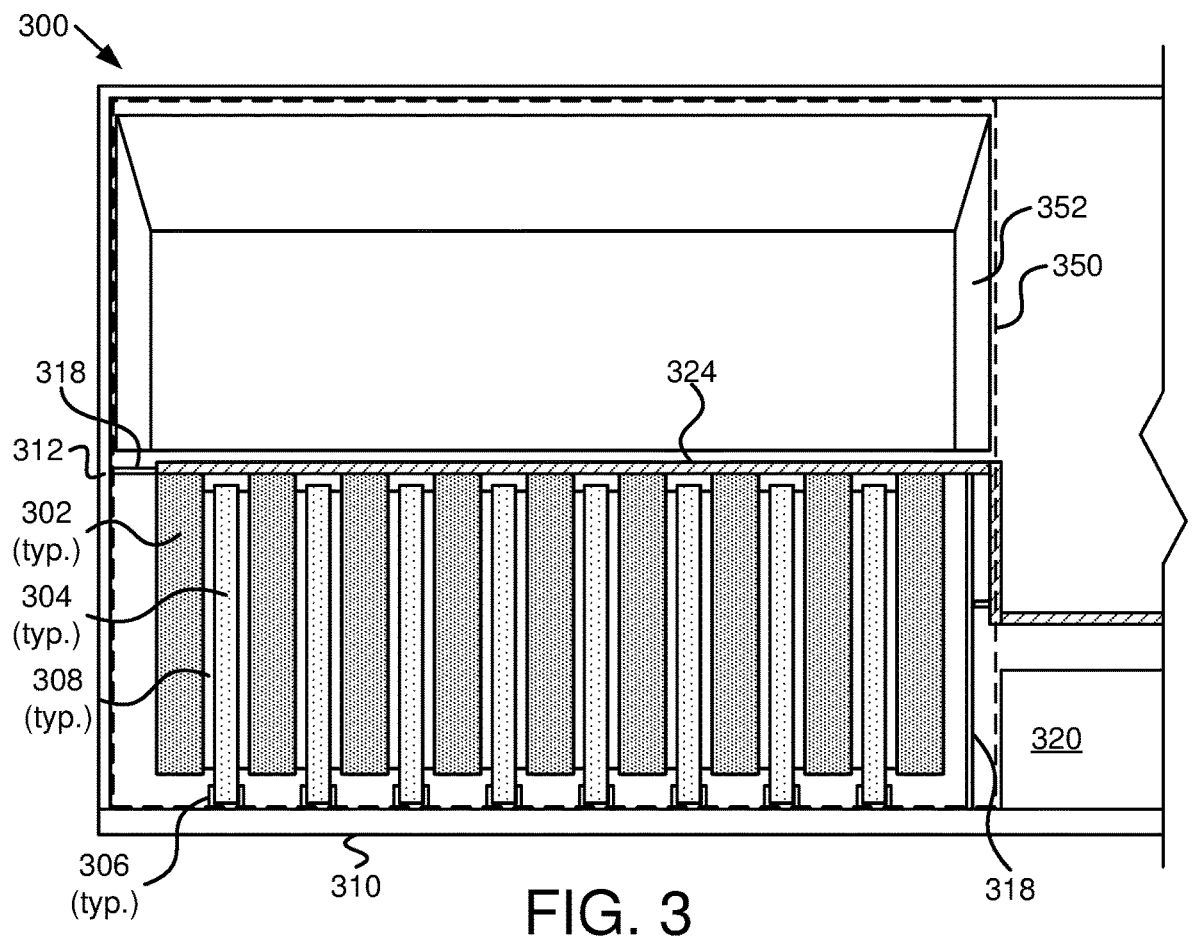
FIG. 3 is a diagram illustrating a side section view of a combination heat sink and air director apparatus with a remote heat sink and an air baffle over memory cards, according to various embodiments.

FIG. 3 is a diagram illustrating a side section view of a combination heat sink and air director apparatus 300 with a remote heat sink and an air baffle over memory cards, according to various embodiments. The combination heat sink and air director apparatus 300 of FIG. 3 includes conduction plates 302, DIMMs 304, DIMM slots 306, TIM pads 308, a motherboard 310, a chassis 312, a securing structure 318, and other components 320 which are substantially similar to those described above with regard to the combination heat sink and air director apparatus 100 of FIGS. 1A-1C. The combination heat sink and air director apparatus 300 of FIG. 3 also includes a remote heat sink 214 located remotely from the DIMMs 104 and a heat transfer structure 324 connected between the conduction plates 302 and the remote heat sink.

The combination heat sink and air director apparatus 300 of FIG. 3 includes an interface 350 where air flow impedance through the interface 350 is chosen to balance air flow through the interface 350 with components 320 adjacent to the interface 350. In the combination heat sink and air director apparatus 300 of FIG. 3, an area above the DIMMs 304 includes an air director component 352 similar to an air baffle and used to balance air flow through the interface 350 and air flow to components 320 adjacent to the interface 350. By including conduction plates 302, TIM pads 308, a heat transfer structure 324, a securing structure 318, etc., air flow above the DIMMs 304 is affected and the air director component 352 above the DIMMs 304 is designed accordingly and may have more air flow than an air baffle in a computing device without conduction plates 302 and TIM pads 308 between the DIMMs 304. The air director component 352, in various embodiments, may include elements that block air, channel air, etc. One of skill in the art will recognize other designs of air director components 352 designed to provide a particular amount of air flow impedance to balance air flow through the interface 350 with components 320 adjacent to the interface 350.

Figure 4:
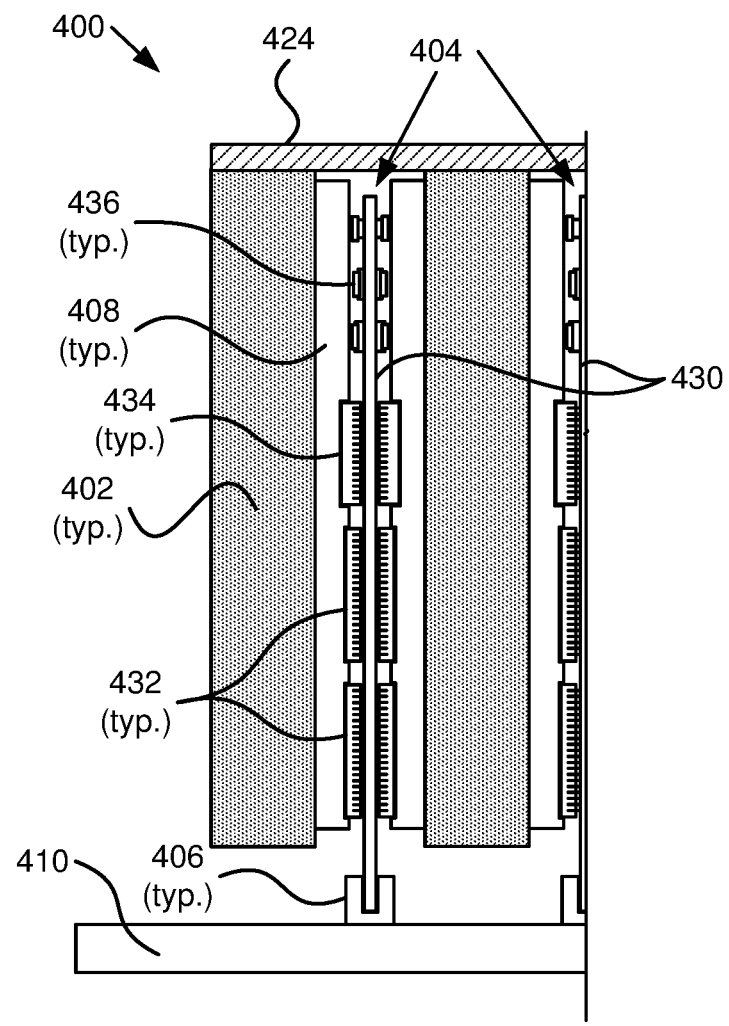
FIG. 4 is a diagram illustrating a detailed side section view of a portion of a combination heat sink and air director apparatus similar to the combination heat sink and air director apparatuses of FIGS. 1A-1C, 2A-2B, and 3, according to various embodiments.

FIG. 4 is a diagram illustrating a detailed side section view of a portion of a combination heat sink and air director apparatus 400 similar to the combination heat sink and air director apparatuses 100, 200, 300 of FIGS. 1A-1C, 2A-2B, and 3 according to various embodiments. The portion of the combination heat sink and air director apparatus 400 includes conduction plates 402, DIMMs 404, DIMM slots 406, TIM pads 408, a motherboard 410, and a heat transfer structure 424, which are substantially similar to those describe above in relation to the combination heat sink and air director apparatuses 100, 200, 300 of FIGS. 1A-1C, 2A-2B, and 3.

The combination heat sink and air director apparatuses 100, 200, 300 of FIGS. 1A-1C, 2A-2B, and 3 depict a DIMM 104, 204, 304 as a rectangle for simplicity, but typically a DIMM 104, 204, 304 includes a printed circuit board and components thereon. In the portion of the combination heat sink and air director apparatus 400 in FIG. 4, the DIMMs 404 include a printed circuit board 430 with components 432, 434, 436 on both sides. The components 432, 434, 436 include memory chips 432, a controller 434, and discrete components 436. Note that the layout of the memory chips 432, controller 434 and discrete components 436 is representative and is not meant to convey actual placement of components on a particular model of a DIMM 404.

The memory chips 432 are depicted to have a lower profile than a controller 434 and the TIM pads 408 deform a different amount for the memory chips 432 and controller 434. The TIM pads 408 deform less for the memory chips 432 than for the controller 434, which extends further from the printed circuit board 430 than the memory chips 432. Note that the TIM pads 408 in FIG. 4 do not touch the discrete components 436, which is typically acceptable because the discrete components 436 generate less heat than the memory chips 432 and/or controller 434. In other embodiments, the TIM pads 408 extend further toward the DIMMs 404 and contact some or all of the discrete components 436. In other embodiments, the controllers 434 are lower profile than the memory chips 432 and the TIM pads 408 contact the memory chips 432 and not the controllers 434 or discrete components 436. In other embodiments, the TIM pads 408 and/or conduction plates 402 are designed to only contact a portion of some components 432, 434, 436.

As depicted in the portion of the combination heat sink and air director apparatus 400 of FIG. 4, there are gaps between and around components 432, 434, 436 due to the location and depth of the TIM pads 408. In some embodiments, a portion of air flow of the computing device flows through the gaps between the components 432, 434, 436 of the DIMMs 404. In some embodiments, air is forced toward the DIMMs 404 to flow through the gaps.

In some embodiments, an air pressure resistance of the conduction plates 102, TIM pads 108, heat sink 114, and/or other components of the combination heat sink and air director apparatus 100 is designed to match an air pressure resistance of air director components 154 replaced by the combination heat sink and air director apparatus 100. The air director components 154 may include one or more ducts, air baffles, and other similar air management equipment. In some embodiments, it is beneficial to maintain air flow of the computing device with the addition of the combination heat sink and air director apparatus 100 in place of an air baffle, an air duct, etc.

In some embodiments, fins 117 of the heat sink 114 are designed with a particular spacing, thickness, etc. to contribute to a particular air pressure resistance. The designed air pressure resistance of the heat sink 114, in some embodiments, differs depending on where the heat sink 114 is located. In other embodiments, a depth that the conduction plates 102 and/or TIM pads 108 extend between the DIMMs 104 is chosen to have a particular air flow resistance. In other embodiments, the combination heat sink and air director apparatus 100 includes other air deflecting parts which block air, redirect air, etc. to achieve a particular air pressure resistance of the combination heat sink and air director apparatus 100. One of skill in the art will recognize other parameters to change, parts to add or modify, etc. to achieve a particular air pressure resistance of the combination heat sink and air director apparatus 100.

FIG. 5A is a diagram illustrating a top view of a combination heat sink and air director apparatus with conduction plates 502 with heat pipes 540 and heat spreaders 542, according to various embodiments. FIG. 5B is a diagram illustrating (a) a top view and (b) a side view of a conduction plate 502 with heat pipes 540 and heat spreaders 542 from the combination heat sink and air director apparatus 500 of FIG. 5A. FIG. 5C is a diagram illustrating (a) an exploded top view and (b) an exploded side view of the conduction plate 502 with heat pipes 540 and heat spreaders 542 from the combination heat sink and air director apparatus 500 of FIG. 5A. The combination heat sink and air director apparatus 500 of FIGS. 5A-5C include conduction plates 502, DIMMs 504, DIMM slots 506, DIMM clips 522, TIM pads 508, a motherboard 510, a heat sink 514 (dashed rectangle showing a location with respect to the conduction plates 502), other components 520, and a heat transfer structure 524, which are substantially similar to those described above in relation to the combination heat sink and air director apparatuses 100, 200, 300, 400 of FIGS. 1A-1C, 2A-2B, 3 and 4.

The conduction plates 502 include heat pipes 540 placed between heat spreaders 542 shaped to thermally couple to the heat pipes 540. While two heat pipes 540 are depicted for each conduction plate 502, more or less heat pipes 540 may be included in other conduction plates 502. The heat pipes 540 are depicted in FIGS. 5B and 5C as extending above the heat spreaders 542 to couple to the heat sink 514 and/or heat transfer structure 524. In other embodiments, the heat pipes 540 and heat spreaders 542 have a top that is level and the heat pipes 540 and heat spreaders 542 connect to the heat sink 514 and/or to the heat transfer structure 524.

The heat spreaders 542 include a material that facilitates heat transfer from the TIM pads 508 to the heat pipes 540. In some embodiments, the heat spreaders 542 are metal, such as copper or aluminum. In other embodiments, the heat spreaders 542 are non-metallic and conduct heat. While the heat spreaders 542 are depicted as being shaped to have a same width as a diameter of the heat pipes 540, in other embodiments, the heat spreaders 542 are not as thick (in a direction perpendicular to the DIMMs 504) as the heat pipes 540 and the TIM pads 508 are shaped to accommodate a different in thickness of the heat spreaders 542 and heat pipes 540. In some embodiments, the heat spreaders 542 have a rectangular edge that is coupled to the heat pipes 540, such as through soldering, brazing, etc. While the conduction plates 502 of the combination heat sink and air director apparatus 500 of FIGS. 5A-5C depict a conduction plate 502 with heat pipes 540 and heat spreaders 542, one of skill in the art will recognize other designs for conduction plates 502 suitable for the combination heat sink and air director apparatuses 100, 200, 300, 400 described herein.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A combination heat sink and air director apparatus comprising:
    a plurality of conduction plates, each conduction plate positioned to extend into a gap between adjacent dual in-line memory modules ("DIMMs") of a plurality of DIMMs previously installed in DIMM slots of a motherboard of a computing device;
    a plurality of thermal interface material ("TIM") pads, wherein TIM pads of the plurality of TIM pads are coupled to each side of each of the plurality of conduction plates; and
    a heat sink thermally coupled to the conduction plates and mounted above the conduction plates,
    wherein an air impedance of air flow through an interface comprising air flow to the heat sink is selected to balance air flow between the interface and components of the computing device adjacent to the interface, wherein a chosen percentage of air flow passes through the interface for the balance of air flow, and
    wherein a conduction plate of the plurality of conduction plates and the TIM pads coupled to each side of the conduction plate are sized to contact and thermally couple to the DIMMs of the plurality of DIMMs on either side of the conduction plate and associated TIM pads.

2. The combination heat sink and air director apparatus of claim 1, wherein thickness of fins of the heat sink, spacing between the fins, height of the fins, and/or air director components in an area along sides and top of the heat sink are chosen to provide the air impedance of air flow through the interface.

3. The combination heat sink and air director apparatus of claim 1, further comprising one or more air director components positioned as part of the interface and configured to contribute to the balance of air flow by producing air flow direction and/or air impedance contributing to the balance of air flow between the interface and the components of the computing device adjacent to the interface.

4. The combination heat sink and air director apparatus of claim 1, wherein the interface further comprises the conduction plates, the TIM pads and the plurality of DIMMs and wherein the conduction plates, TIM pads, heat sink, and/or one or more air director components are located and shaped to provide an amount of air flow at the interface to allow the chosen percentage of air flow to pass through the interface.

5. The combination heat sink and air director apparatus of claim 4, wherein each conduction plate of the plurality of conduction plates and associated TIM pads of the plurality of TIM pads are sized to extend along a length of the gap between DIMMs of the plurality of DIMMs an amount to allow a chosen amount of air flow around the conduction plates, TIM pads and DIMMs and to conduct a selected amount of heat from the DIMMs to the TIM pads and conduction plates to the heat sink.

6. The combination heat sink and air director apparatus of claim 1, wherein each of the plurality of conduction plates comprises one or more heat pipes coupled to the heat sink.

7. The combination heat sink and air director apparatus of claim 6, further comprising a heat spreader coupled to the one or more heat pipes.

8. The combination heat sink and air director apparatus of claim 1, wherein each conduction plate of the plurality of conduction plates and associated TIM pads of the plurality of TIM pads substantially extend along a length of the gap between DIMMs of the plurality of DIMMs.

9. The combination heat sink and air director apparatus of claim 1, wherein a TIM pad positioned between a DIMM of the plurality of DIMMs and a conduction plate of the plurality of conduction plates is in thermal contact with a memory chip and/or a controller of the DIMM.

10. The combination heat sink and air director apparatus of claim 9, wherein the memory chip and the controller extend a different distance away from a circuit board of each DIMM of the plurality of DIMMs and wherein each TIM pad of the plurality of TIM pads deforms to come into thermal contact with both the memory chip and the controller when a conduction plate of the plurality of conduction plates with TIM pads of the plurality of TIM pads on each side is inserted between DIMMs of the plurality of DIMMs.

11. The combination heat sink and air director apparatus of claim 1, wherein air flow through the computing device is in a direction parallel to slots for the plurality of DIMMs and the interface is at an upstream side of the plurality of DIMMs.

12. The combination heat sink and air director apparatus of claim 1, wherein at least one of the components of the computing device adjacent to the interface comprises a processor.

13. The combination heat sink and air director apparatus of claim 1, further comprising a conduction plate extending along an outer side of a DIMM of the plurality of DIMMs at an end of the plurality of DIMMs and a TIM pad coupled to the conduction plate and positioned between the DIMM and the conduction plate.

14. A computing device comprising:
a motherboard comprising a processor;
a plurality of dual in-line memory module ("DIMM") slots coupled to the motherboard;
a plurality of DIMMs inserted into each of the plurality of DIMM slots; and
a combination heat sink and air director apparatus comprising:
a plurality of conduction plates, each conduction plate positioned to extend into a gap between adjacent DIMMs of the plurality of DIMMs after insertion of the DIMMs into the DIMM slots;
a plurality of thermal interface material ("TIM") pads, wherein TIM pads of the plurality of TIM pads are coupled to each side of each of the plurality of conduction plates; and
a heat sink thermally coupled to the conduction plates and mounted above the conduction plates,
wherein an air impedance of air flow through an interface comprising air flow to the heat sink is selected to balance air flow between the interface and components of the computing device adjacent to the interface, wherein a chosen percentage of air flow passes through the interface for the balance of air flow, and
wherein a conduction plate of the plurality of conduction plates and the TIM pads coupled to each side of the conduction plate are sized to contact and thermally couple to the DIMMs of the plurality of DIMMs on either side of the conduction plate and associated TIM pads.

15. The computing device of claim 14, wherein thickness of fins of the heat sink, spacing between the fins, height of the fins, and/or air director components in an area along sides and top of the heat sink are chosen to provide the air impedance of air flow through the interface.

16. The computing device of claim 14, wherein the combination heat sink and air director apparatus further comprises one or more air director components positioned as part of the interface and configured to contribute to the balance of air flow by producing air flow direction and/or air impedance contributing to the balance of air flow between the interface and the components of the computing device adjacent to the interface.

17. The computing device of claim 14, wherein the interface further comprises the conduction plates, the TIM pads and the plurality of DIMMs and wherein the conduction plates, TIM pads, heat sink, and/or one or more air director components are located and shaped to provide an amount of air flow at the interface to allow the chosen percentage of air flow to pass through the interface.

18. The computing device of claim 17, wherein each conduction plate of the plurality of conduction plates and associated TIM pads of the plurality of TIM pads are sized to extend along a length of the gap between DIMMs of the plurality of DIMMs an amount to allow a chosen amount of air flow around the conduction plates, TIM pads and DIMMs and to conduct a selected amount of heat from the DIMMs to the TIM pads and conduction plates to the heat sink.

19. The computing device of claim 14, wherein a TIM pad positioned between a DIMM of the plurality of DIMMs and a conduction plate of the plurality of conduction plates is in thermal contact with a memory chip and/or a controller of the DIMM.

20. A combination heat sink and air director apparatus comprising:
a plurality of conduction plates, each conduction plate positioned to extend into a gap between adjacent dual in-line memory modules ("DIMMs") of a plurality of DIMMs previously installed in DIMM slots of a motherboard of a computing device;
a plurality of thermal interface material ("TIM") pads, wherein TIM pads of the plurality of TIM pads are coupled to each side of each of the plurality of conduction plates;
a heat sink thermally coupled to the conduction plates and mounted above the conduction plates; and
one or more air director components,
wherein an air impedance of air flow through an interface comprising air flow to at least the heat sink and the one or more air director components is selected to balance air flow between the interface and components of the computing device adjacent to the interface, wherein a chosen percentage of air flow passes through the interface for the balance of air flow, and
wherein a conduction plate of the plurality of conduction plates and the TIM pads coupled to each side of the conduction plate are sized to contact and thermally couple to the DIMMs of the plurality of DIMMs on either side of the conduction plate and associated TIM pads.

* * * * *